(12) United States Patent
Chen et al.

(10) Patent No.: US 11,244,860 B2
(45) Date of Patent: Feb. 8, 2022

(54) DOUBLE PATTERNING INTERCONNECT INTEGRATION SCHEME WITH SAV

(71) Applicant: INTERNATIONAL BUSINESS MACHINES CORPORATION, Armonk, NY (US)

(72) Inventors: Shyng-Tsong Chen, Rensselaer, NY (US); Terry A. Spooner, Mechanicville, NY (US); Koichi Motoyama, Clifton Park, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/659,717

(22) Filed: Oct. 22, 2019

(65) Prior Publication Data
US 2021/0118732 A1 Apr. 22, 2021

(51) Int. Cl.
*H01L 21/768* (2006.01)
*H01L 23/522* (2006.01)
*H01L 23/528* (2006.01)

(52) U.S. Cl.
CPC .. *H01L 21/76897* (2013.01); *H01L 21/76807* (2013.01); *H01L 21/76877* (2013.01); *H01L 23/528* (2013.01); *H01L 23/5226* (2013.01)

(58) Field of Classification Search
CPC ......... H01L 21/76897; H01L 21/76807; H01L 23/5226; H01L 21/76877; H01L 23/528
See application file for complete search history.

(56) References Cited

U.S. PATENT DOCUMENTS

| | | | |
|---|---|---|---|
| 6,087,251 A * | 7/2000 | Hsu | H01L 21/76883 438/618 |
| 8,105,867 B2 | 1/2012 | Matamis et al. | |

(Continued)

FOREIGN PATENT DOCUMENTS

| | | |
|---|---|---|
| WO | 2015047321 A1 | 4/2015 |
| WO | 2017165206 A1 | 9/2017 |

OTHER PUBLICATIONS

Tetsuya Homma, Low dielectric constant materials and methods for interlayer dielectric films in ultralarge-scale integrated circuit multilevel interconnections, Materials Science and Engineering. R23 (1998) 243-285 (Year: 1998).*

(Continued)

*Primary Examiner* — Shih Tsun A Chou
(74) *Attorney, Agent, or Firm* — Tutunjian & Bitetto, P.C.; L. Jeffrey Kelly

(57) ABSTRACT

A method is presented for forming self-aligned vias by employing top level line double patterns. The method includes forming a plurality of first conductive lines within a first dielectric material, recessing one or more of the plurality of first conductive lines to define first openings, filling the first openings with a second dielectric material, and forming sacrificial blocks perpendicular to the plurality of first conductive lines. The method further includes forming vias directly underneath the sacrificial blocks, removing the sacrificial blocks, and constructing a plurality of second conductive lines such that the vias align to both the plurality of first conductive lines and the plurality of second conductive lines.

16 Claims, 7 Drawing Sheets

(56) References Cited

U.S. PATENT DOCUMENTS

| | | | |
|---|---|---|---|
| 8,298,943 | B1 | 10/2012 | Arnold et al. |
| 9,041,217 | B1 | 5/2015 | Bristol et al. |
| 9,219,007 | B2 | 10/2015 | Chen et al. |
| 9,236,342 | B2 | 1/2016 | Bristol et al. |
| 9,324,650 | B2 | 4/2016 | Edelstein et al. |
| 9,478,462 | B1 | 10/2016 | Wang et al. |
| 9,490,168 | B1 | 11/2016 | Chen et al. |
| 9,607,893 | B1 | 3/2017 | Zhang et al. |
| 2001/0055872 | A1* | 12/2001 | Fukazawa ......... H01L 21/76838 438/622 |
| 2005/0059240 | A1* | 3/2005 | Choi ................. H01L 21/76867 438/679 |
| 2014/0208285 | A1* | 7/2014 | Kye ........................ G06F 30/39 716/126 |
| 2016/0204002 | A1 | 7/2016 | Wallace et al. |
| 2017/0263553 | A1 | 9/2017 | Schenker et al. |
| 2018/0040631 | A1* | 2/2018 | Kim ..................... H01L 29/785 |

OTHER PUBLICATIONS

Briggs et al., "Fully Aligned Via Integration for Extendibility of Interconnects to Beyond the 7 nm Node", 2017 IEEE International Electron Devices Meeting (IEDM). Dec. 2, 2017. pp. 1-4.

* cited by examiner

US 11,244,860 B2

DOUBLE PATTERNING INTERCONNECT INTEGRATION SCHEME WITH SAV

BACKGROUND

The present invention relates generally to semiconductor devices, and more specifically, to double patterning interconnect integration schemes with fully self-aligned vias.

As process dimensions continue to shrink, litho-etch patterning for semiconductor devices is usually needed to print 64 nanometer (nm) pitch metal layers (Mx levels) or below. However, larger than ideal overlay error due to litho tool limitation can be a significant factor for consideration in successful patterning applications. For example, without self-aligned via (SAV) processes, the dielectric space between copper lines and vias can become small, which can cause yield and reliability issues.

SUMMARY

In accordance with an embodiment, a method is provided for forming self-aligned vias by employing top level line double patterns. The method includes forming a plurality of first conductive lines within a first dielectric material, recessing one or more of the plurality of first conductive lines to define first openings, filling the first openings with a second dielectric material, and forming sacrificial blocks perpendicular to the plurality of first conductive lines. The method further includes forming vias directly underneath the sacrificial blocks, removing the sacrificial blocks, and constructing a plurality of second conductive lines such that the vias align to both the plurality of first conductive lines and the plurality of second conductive lines.

In accordance with another embodiment, a method is provided for forming self-aligned vias by employing top level line double patterns. The method includes forming a plurality of first conductive lines within a first dielectric material, depositing a block mask over one or more of the plurality of first conductive lines, recessing exposed conductive lines of the plurality of first conductive lines to define first gaps, removing the block mask, filling the first gaps with a second dielectric material, and depositing a sacrificial layer. The method further includes etching the sacrificial layer to form sacrificial blocks, recessing remaining exposed conductive lines to define second gaps and vias, filling the second gaps with a third dielectric material, forming trenches within the third dielectric material, removing the sacrificial blocks to define third gaps, and filling the trenches and the third gaps with a conductive material to define a plurality of second conductive lines such that the vias align to both the plurality of first conductive lines and the plurality of second conductive lines.

In accordance with yet another embodiment, a semiconductor device is provided for forming self-aligned vias by employing top level line double patterns. The semiconductor device includes a plurality of first conductive lines disposed within a first dielectric material, a plurality of second conductive lines disposed perpendicular to the plurality of first conductive lines, and vias disposed directly between the plurality of first and second conductive lines, wherein the vias are aligned to both the plurality of first and second conductive lines.

It should be noted that the exemplary embodiments are described with reference to different subject-matters. In particular, some embodiments are described with reference to method type claims whereas other embodiments have been described with reference to apparatus type claims.

However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
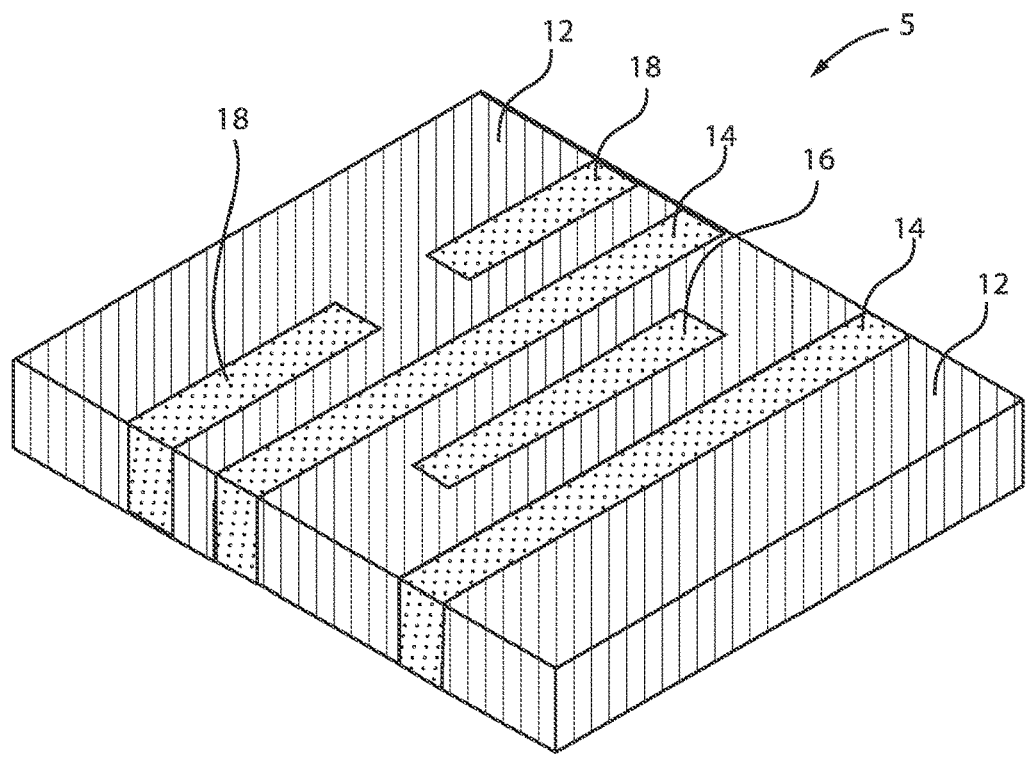
FIG. 1 is a perspective view of a semiconductor structure including a plurality of conductive lines formed within a dielectric layer, in accordance with an embodiment of the present invention.

Embodiments in accordance with the present invention provide methods and devices for employing a top line pattern to form vias between top and bottom conductive lines such that the vias can be fully aligned to both top and bottom conductive lines. In conventional fully aligned via (FAV) schemes, the FAVs are formed by selective metal deposition techniques. With the 7 nm technology node in the development phase and the 5 nm node moving into development, transistor scaling gets ever more complex. On top of that, performance benefits gained at the front-end-of-line (e.g., the transistors) can easily be undone if similar improvements are not made in the back-end-of-the-line (BEOL). BEOL processing involves the creation of stacked layers of metal wires that electrically interconnect transistors in a chip. With each technology node, this metal wiring scheme becomes more complex, mainly because there are more transistors to connect with an ever tighter pitch. Shrinking dimensions also means the wires have a reduced cross-sectional area, which drives up the resistance-capacitance product (RC) of the interconnect system.

Metal-based dual damascene has been the workhorse process flow for interconnects. The metal can be, e.g., copper (Cu). A simple dual damascene flow starts with deposition of a low-k dielectric material on a structure. These low-k films are designed to reduce the capacitance and the delay in the integrated circuits (ICs). In a next step, this dielectric layer is covered with an oxide and a resist, and vias and trenches are formed using lithography and etch steps. These vias connect one metal layer with the layer above or below. Then, a metallic barrier layer is added to prevent metal atoms from migrating into the low-k materials. The barrier layers are deposited with, e.g., physical vapor deposition (PVD), using materials such as, e.g., tantalum and tantalum nitride. In a final step, this structure is seeded, electroplated with a metal (usually Cu), followed by a chemical mechanical planarization (CMP) step. However, such conventional FAV schemes can result in chip yield and reliability issues.

Embodiments in accordance with the present invention provide methods and devices for constructing self-aligned vias by employing top level line double patterns, which can significantly reduce or eliminate chip yield and reliability issues. The via level litho process is skipped in the integration scheme. The self-aligned vias are constructed by using a sacrificial line pattern to form the vias, and then convert the sacrificial line patterns into metal line patterns. As a result, the vias are fully aligned to the top level and bottom level conductive or metal lines. Additionally, the exemplary embodiments of the present invention eliminate line-to-via litho alignment errors, minimize contact resistance, maximize via current, and improve via reliability.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a perspective view of a semiconductor structure including a plurality of conductive lines formed within a dielectric layer, in accordance with an embodiment of the present invention.

In various example embodiments, the semiconductor structure 5 includes a plurality of conductive lines formed in a dielectric material 12. In one instance, first conductive lines 14 can be formed extending from one end (proximal most end) of the dielectric material 12 to the other end (distal most end) of the dielectric material 12. A second conductive line 16 can be formed in a middle or central section of the dielectric material 12. A third conductive line 18 can also be formed that includes segmented sections or portions. The plurality of conductive lines 14, 16, 18 can be configured to be parallel to each other. The plurality of conductive lines 14, 16, 18 can be configured to have an equal or unequal width. The plurality of conductive lines 14, 16, 18 can be configured to extend from a topmost portion to a bottommost portion of the dielectric material 12. The plurality of conductive lines 14, 16, 18 can be metal lines.

The dielectric material 12 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

Alternatively, dielectric material 12 can include any interlayer dielectric such as but not limited to: silicon nitride ($Si_3N_4$), silicon oxide ($SiO_2$), fluorinated $SiO_2$ (FSG), and low k dielectrics like hydrogenated silicon oxycarbide (Si-COH), porous SiCOH, boro-phospho-silicate glass (BPSG), silsesquioxanes, carbon (C) doped oxides (e.g., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material, other ultra-low k (ULK) based on SiCOH with low dielectric constant (k<2.7) material, or layers thereof. The precise thickness of dielectric material 12 can vary widely with the intended application.

The plurality of conductive lines 14, 16, 18 can be formed in openings or trenches formed in the dielectric material 12. The conductive lines 14, 16, 18 can be any conductive materials known in the art, such as, for example, copper (Cu), aluminum (Al), Cobalt (Co), Ruthenium (Ru) or tungsten (W), etc. In one example, more than one type of metal may be used to form the metal lines. The conductive lines 14, 16, 18 can be fabricated using any technique known in the art, such as, for example, a single or dual damascene technique.

Figure 2:
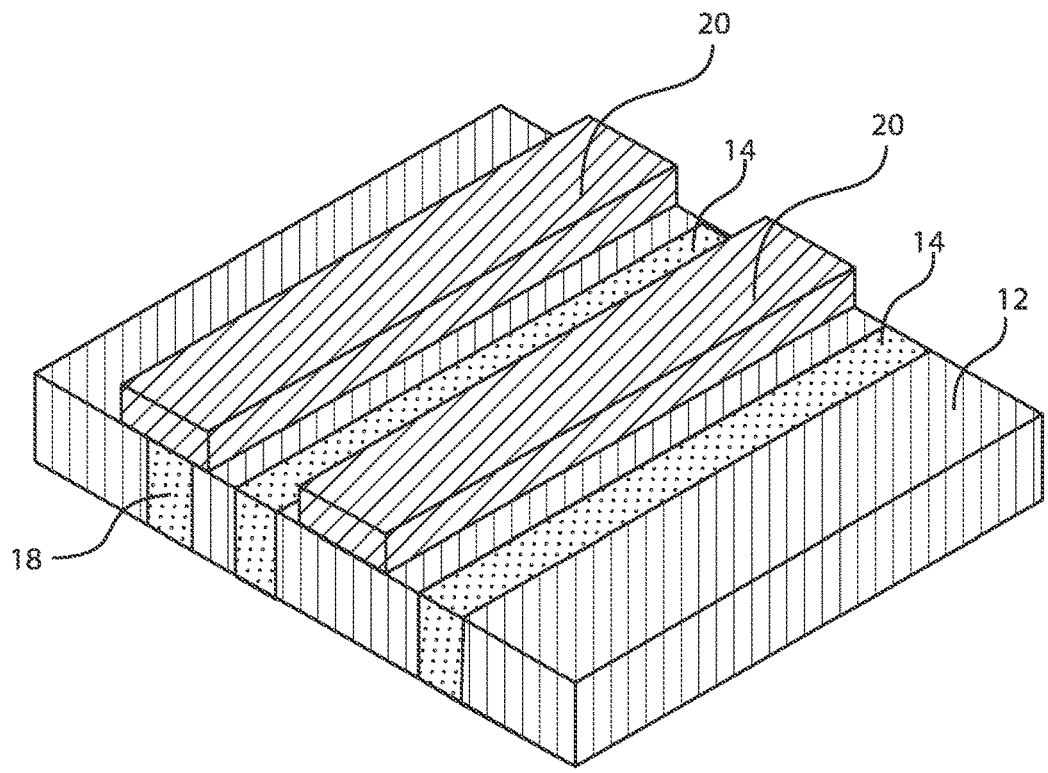
FIG. 2 is a perspective view of the semiconductor structure of FIG. 1 where a block mask is deposited over one or more conductive lines, in accordance with an embodiment of the present invention.

FIG. 2 is a perspective view of the semiconductor structure of FIG. 1 where a block mask is deposited over one or more conductive lines, in accordance with an embodiment of the present invention.

In various example embodiments, a block mask 20 is deposited over one or more of the conductive or metal lines. In one instance, the block mask 20 is deposited over conductive line 18. Another block mask 20 is deposited over conductive line 16. The block mask 20 extends from the proximal most end of the dielectric material 12 to the distal most end of the dielectric material 12. The block mask 20 covers the entirety of the conductive lines 16, 18. The block mask 20 directly contacts conductive lines which will have vias subsequently formed over or on top of it. It is noted that no block mask is formed over the conductive lines 14. Thus, a top surface of conductive lines 14 remains exposed.

The block mask 20 can include a dielectric oxide or dielectric nitride. In one embodiment, the block mask 20 includes silicon dioxide. The block mask 20 can be formed, for example, by chemical vapor deposition (CVD), Plasma Enhanced CVD (PECVD) or atomic layer deposition (ALD). The thickness of the block mask 20 can be from about 10 nm to about 50 nm, although lesser and greater thicknesses can also be employed.

In another example, the block mask 20 can include a photosensitive material deposited using known methods (e.g., a spin coating process) followed by photolithography. The block mask 20 can be, for example, a nitride hardmask. Alternatively, the block mask 20 can include a hardmask layer such as amorphous carbon.

Figure 3:
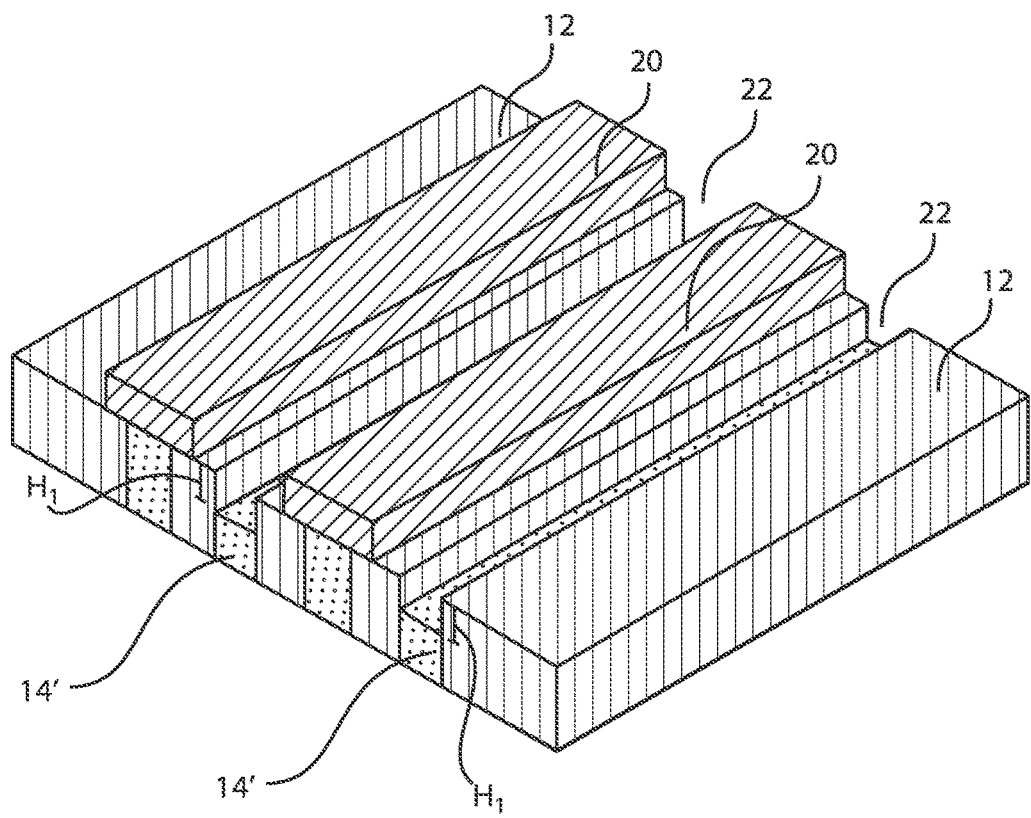
FIG. 3 is a perspective view of the semiconductor structure of FIG. 2 where the exposed conductive lines are recessed, in accordance with an embodiment of the present invention.

FIG. 3 is a perspective view of the semiconductor structure of FIG. 2 where the exposed conductive lines are recessed, in accordance with an embodiment of the present invention.

In various example embodiments, the unblocked metal lines are recessed. For example, the conductive lines 14 are recessed by a height "$H_1$." This results in remaining conductive lines 14'. In one instance, the recess can be approximately half the height of the dielectric material 12. The recess of conductive lines 14 creates a gap or opening 22 over the remaining conductive lines 14'. The recess does not affect the dielectric material 12 and the block mask 20.

The conductive lines 14 can be etched by, for example, employing a reactive ion etch (RIE) process or a halogen-based chemical etch process (e.g., including chlorine-containing gas and/or fluorine-containing gas chemistry).

In general, regarding the etching of any materials, such materials can be removed by a dry etching process, for example, ashing. Ashing is performed using a suitable reaction gas, for example, $O_2$, $N_2$, $H_2/N_2$, $O_3$, $CF_4$, or any combination thereof. The dry etching process can be combined with a wet etching process. The wet etching process can be performed, for example, with a wet etchant, such as sulfuric acid and hydrogen peroxide.

Figure 4:
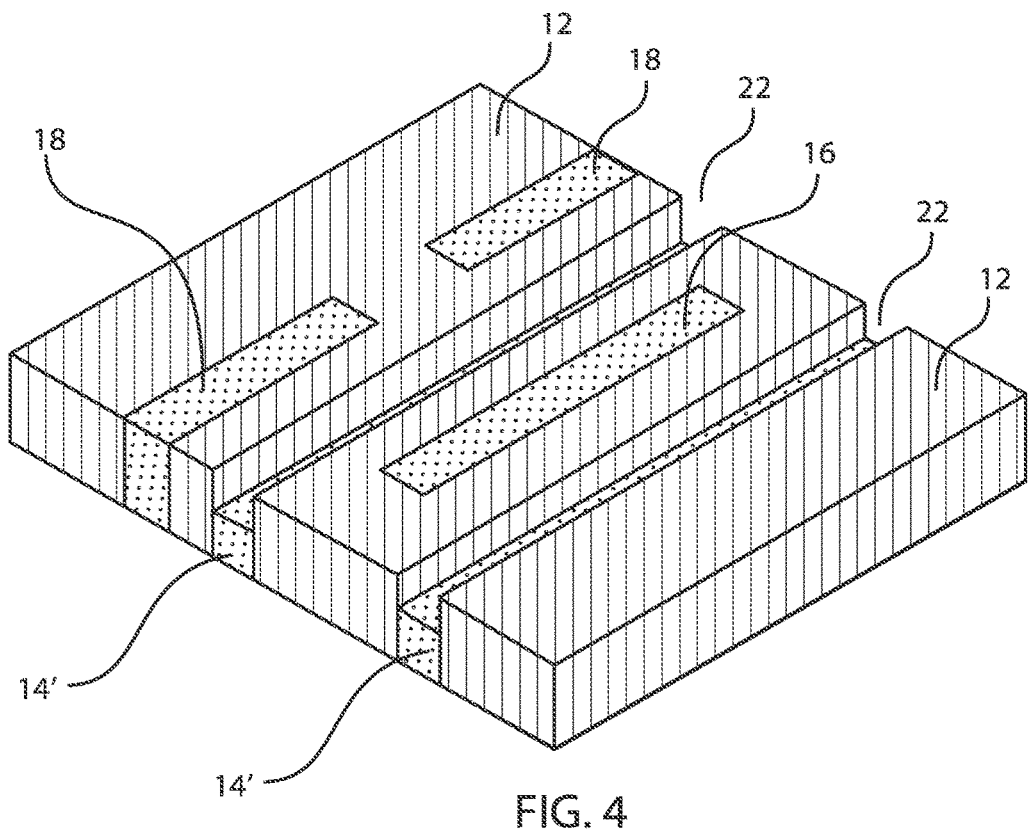
FIG. 4 is a perspective of the semiconductor structure of FIG. 3 where the block mask is stripped to expose all of the plurality of conductive lines, in accordance with an embodiment of the present invention.

FIG. 4 is a perspective of the semiconductor structure of FIG. 3 where the block mask is stripped to expose all of the plurality of conductive lines, in accordance with an embodiment of the present invention.

In various example embodiments, the block mask 20 is stripped. The etch can, for example, include a wet etch such as a phosphoric acid ($H_3PO_4$) (wet chemistry) etch or a diluted hydrogen fluoride (HF) etch. The stripping of the block mask 20 results in exposure of the conductive line 16 and the conductive line 18. The remaining conductive lines 14' remain intact.

Figure 5:
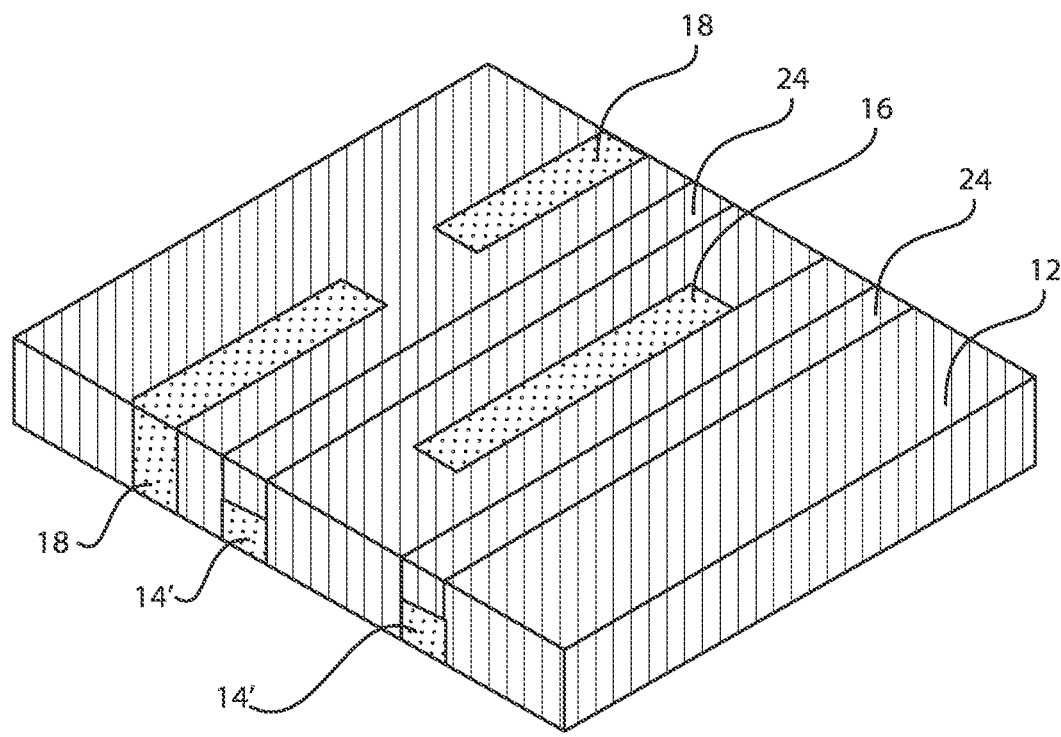
FIG. 5 is a perspective view of the semiconductor structure of FIG. 4 where a dielectric material is deposited over the recessed conductive lines, in accordance with an embodiment of the present invention.

FIG. 5 is a perspective view of the semiconductor structure of FIG. 4 where a dielectric material is deposited over the recessed conductive lines, in accordance with an embodiment of the present invention.

In various example embodiments, the recessed portions are backfilled with dielectric material 24. In one example, the dielectric material 24 can be the same material as dielectric material 12. The backfill results in covering the remaining conductive lines 14'. Thus, only top surfaces of conductive lines 16, 18 remain exposed.

Figure 6:
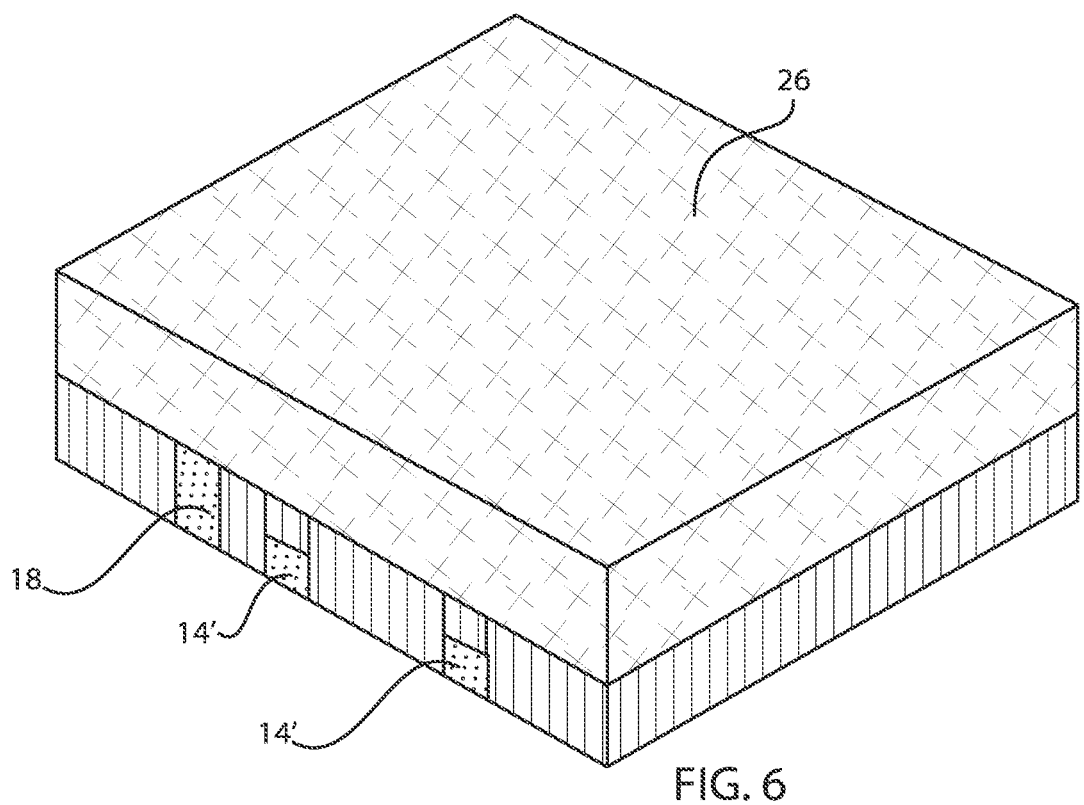
FIG. 6 is a perspective view of the semiconductor structure of FIG. 5 where a sacrificial material layer is deposited, in accordance with an embodiment of the present invention.

FIG. 6 is a perspective view of the semiconductor structure of FIG. 5 where a sacrificial material layer is deposited, in accordance with an embodiment of the present invention.

In various example embodiments, a sacrificial material layer 26 is deposited.

The sacrificial material layer 26 can be, e.g., amorphous conformal carbon or an amorphous silicon material or silicon nitride. A planarization process, for example, chemical mechanical planarization (CMP), can be performed to polish the surface of the sacrificial material 26. The sacrificial material 26 can be deposited by a suitable deposition process, for example, CVD, or other suitable process.

Figure 7:
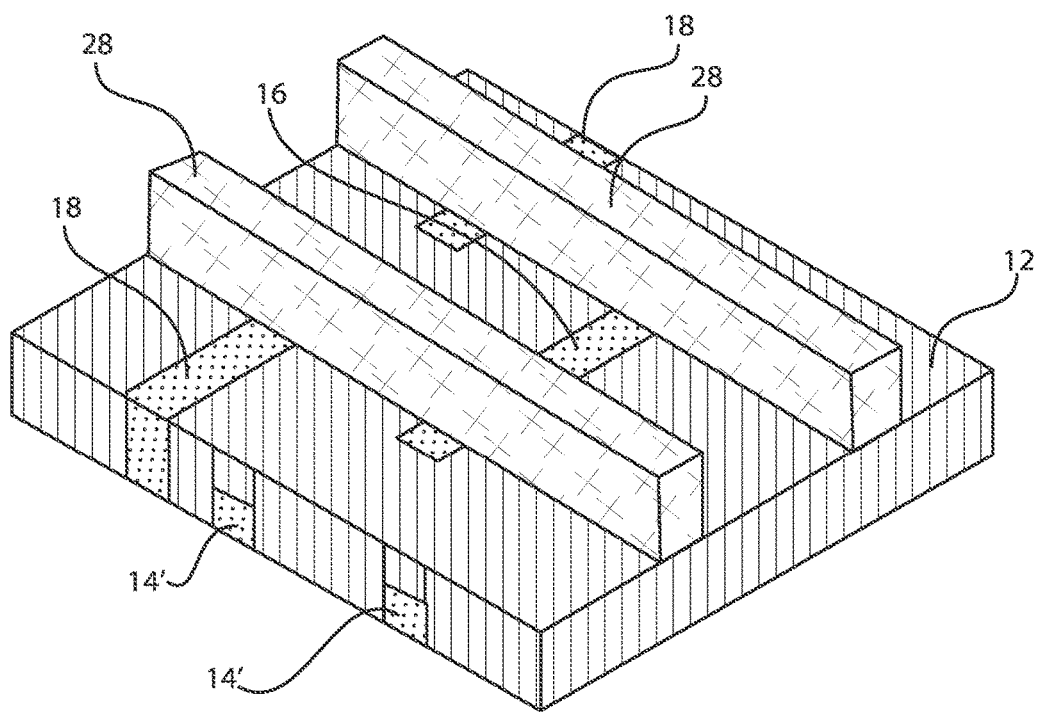
FIG. 7 is a perspective view of the semiconductor structure of FIG. 6 where the sacrificial material layer is etched to form sacrificial blocks, in accordance with an embodiment of the present invention.

FIG. 7 is a perspective view of the semiconductor structure of FIG. 6 where the sacrificial material layer is etched to form sacrificial blocks, in accordance with an embodiment of the present invention.

In various example embodiments, the sacrificial material layer 26 is etched to form sacrificial blocks 28. Sacrificial blocks 28 are configured to be perpendicular to the plurality of conductive lines 14, 16, 18. The sacrificial blocks 28 directly contact a portion of the top surface of the conductive line 16 and the conductive line 18. The sacrificial blocks 28 extend along an entire length of the dielectric material 12.

Figure 8:
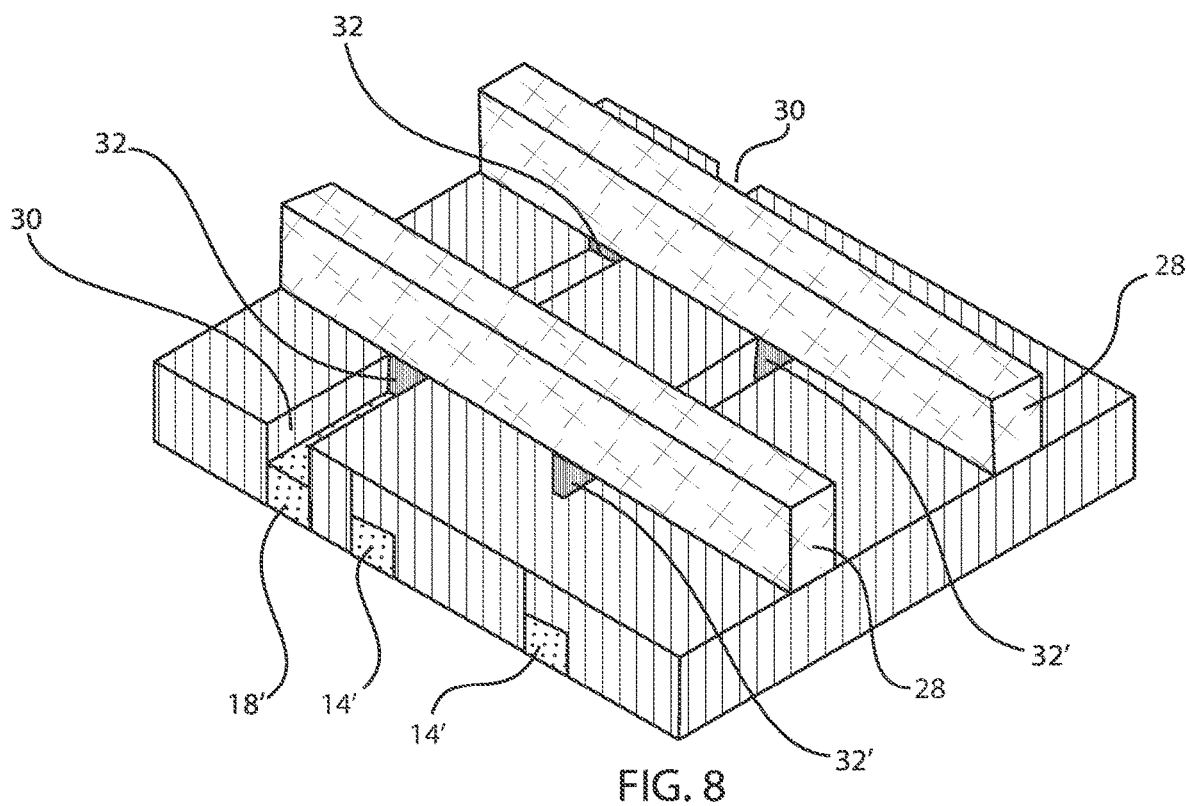
FIG. 8 is a perspective view of the semiconductor structure of FIG. 7 where the exposed conductive lines are recessed to form vias, in accordance with an embodiment of the present invention.

FIG. 8 is a perspective view of the semiconductor structure of FIG. 7 where the exposed conductive lines are recessed to form vias, in accordance with an embodiment of the present invention.

In various example embodiments, the exposed portions or sections of the conductive lines 16, 18 are recessed to form vias 32, 32'. The recess 30 results in remaining conductive line 18', as well as remaining lines 16'. The vias 32, 32' directly contact the sacrificial blocks 28. A first set of vias 32 is formed from the conductive line 18 and a second set of vias 32' are formed from the metal conductive 16' (illustrated in structure 45' of FIG. 13).

Figure 9:
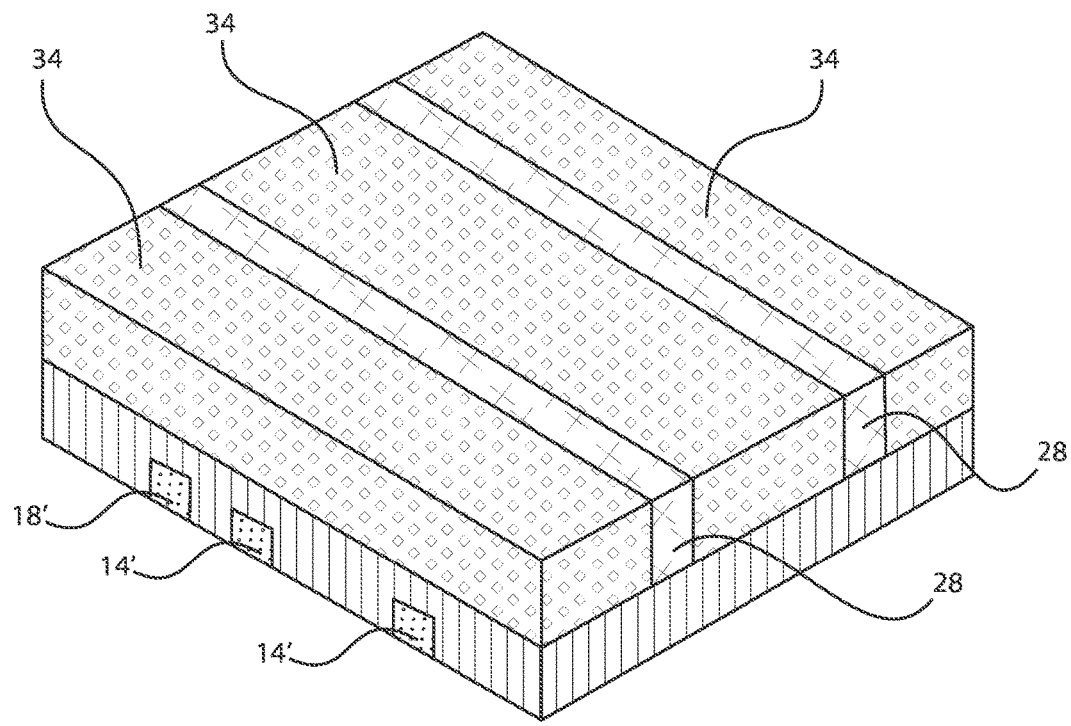
FIG. 9 is a perspective view of the semiconductor structure of FIG. 8 where another dielectric material is deposited over the recessed conductive lines, in accordance with an embodiment of the present invention.

FIG. 9 is a perspective view of the semiconductor structure of FIG. 8 where another dielectric material is deposited over the recessed conductive lines, in accordance with an embodiment of the present invention.

In various example embodiments, another dielectric material 34 is deposited over the recessed portions and over the sacrificial blocks 28. The dielectric material 34 can then be planarized by, e.g., CMP, such that a top surface of the sacrificial blocks 28 is exposed. The top surface of the dielectric material 34 is thus flush with a top surface of the sacrificial blocks 28. In one example, the dielectric material 34 can be the same material as the material for dielectric material 12 and dielectric material 24.

Figure 10:
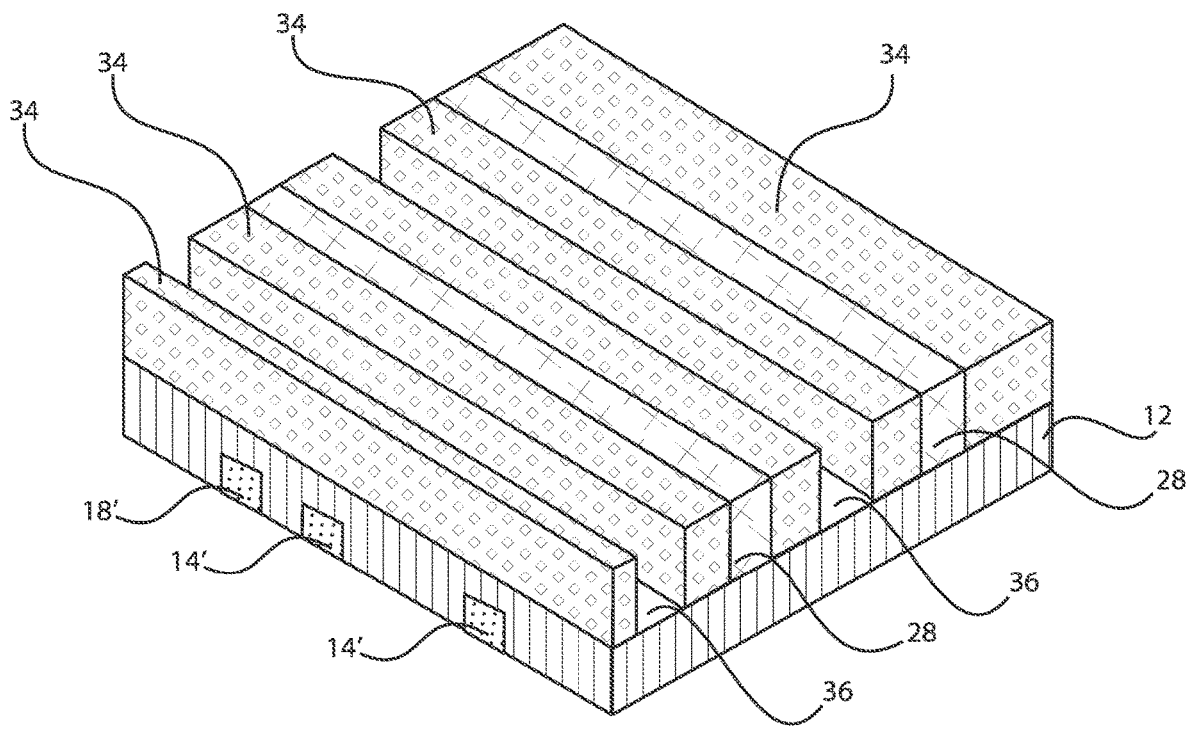
FIG. 10 is a perspective view of the semiconductor structure of FIG. 9 where trenches are formed by etching in locations without vias below, in accordance with an embodiment of the present invention.

FIG. 10 is a perspective view of the semiconductor structure of FIG. 9 where trenches are formed by etching in locations without vias below, in accordance with an embodiment of the present invention.

In various example embodiments, trenches 36 are formed by etching in locations without vias below. The sacrificial blocks 28 remain intact. The conductive lines 14', 16', 18' also remain intact. The trenches 36 are formed parallel to the sacrificial blocks 28. Two trenches 36 are shown for illustrative purposes.

Figure 11:
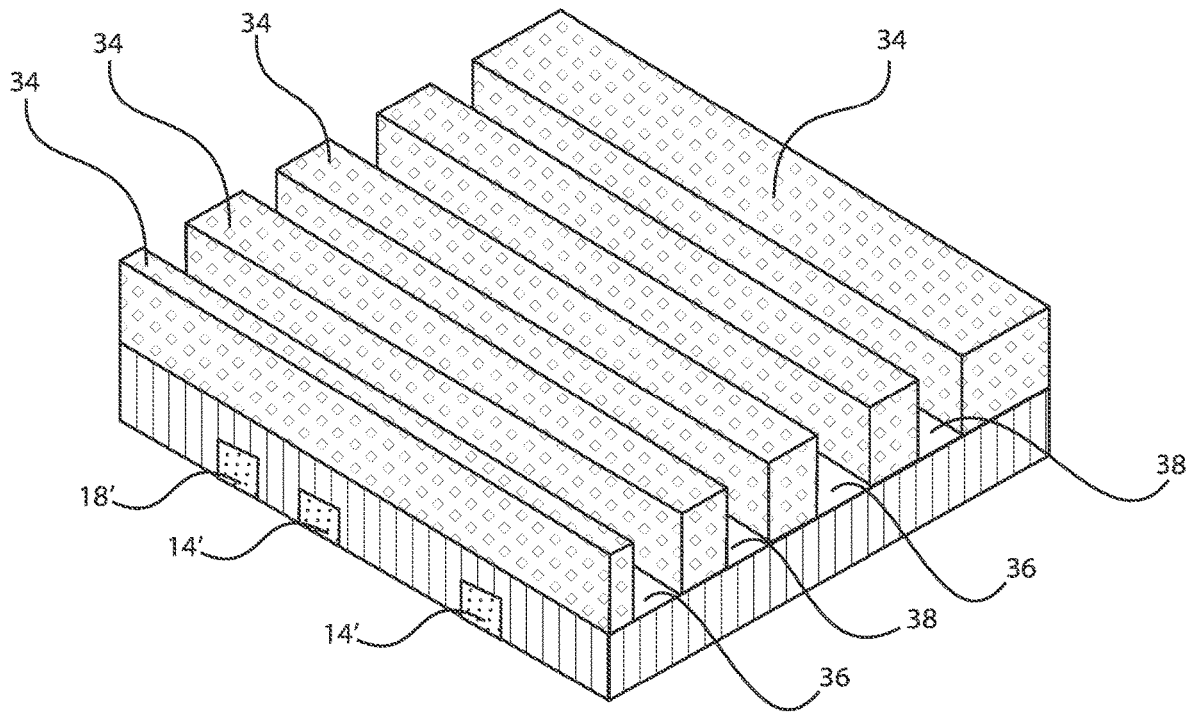
FIG. 11 is a perspective view of the semiconductor structure of FIG. 10 where the sacrificial blocks are removed, in accordance with an embodiment of the present invention.

FIG. 11 is a perspective view of the semiconductor structure of FIG. 10 where the sacrificial blocks are removed, in accordance with an embodiment of the present invention.

In various example embodiments, the sacrificial blocks 28 are removed, thus forming gaps or openings or trenches 38. The gaps 38 alternate with the gaps 36. As a result, there are a total of four exemplary gaps that are shown for illustrative purposes. The gaps 36, 38 extend a length of the dielectric material 34. The gaps 36, 38 are formed perpendicular to the conductive lines 14', 16', 18'. The gaps 36, 38 are parallel to each other and extend an entire length of the dielectric material 12.

Figure 12:
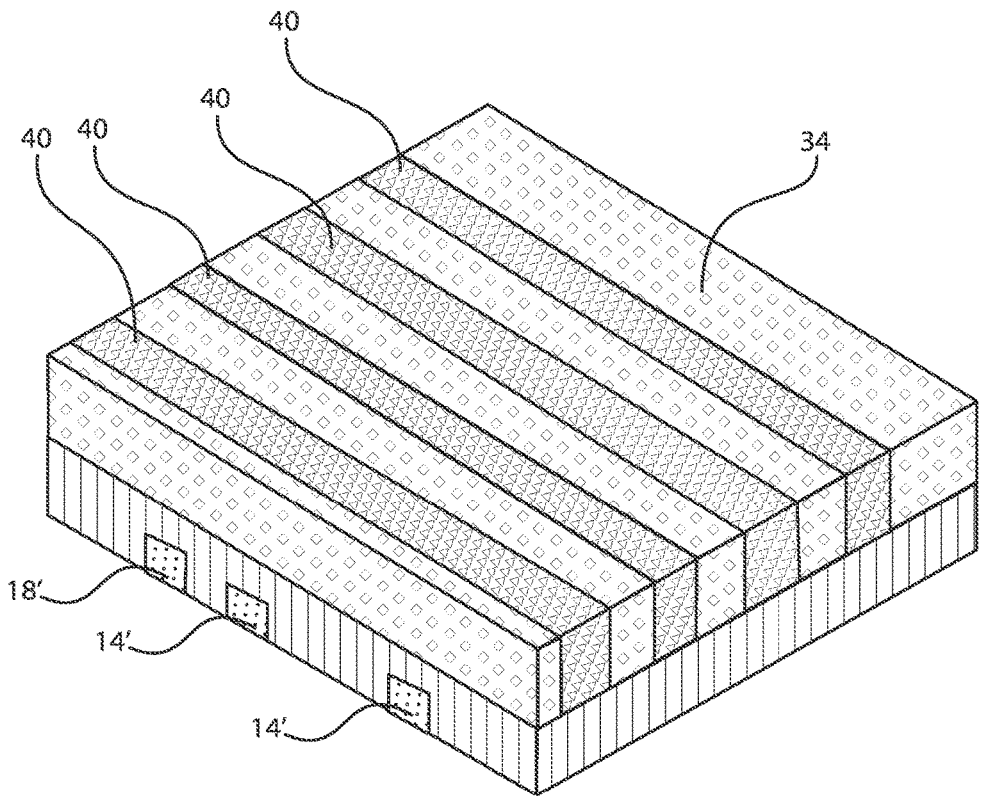
FIG. 12 is a perspective view of the semiconductor structure of FIG. 11 where a metal fill takes place, in accordance with an embodiment of the present invention.

FIG. 12 is a perspective view of the semiconductor structure of FIG. 11 where a metal fill takes place, in accordance with an embodiment of the present invention.

In various example embodiments, the gaps 36, 38 are filled with a conductive material 40. The conductive material 40 can be planarized by, e.g., CMP, such that a top surface of the conductive material 40 is flush with the top surface of the dielectric material 34. Thus, the strips of conductive material 40 are perpendicular to the conductive lines 14', 16', 18' formed underneath.

The conductive material or conductive material strips 40 can be, e.g., Ta, Ti/TiN, W, WN, TaN, polysilicon, doped polysilicon, amorphous silicon, doped amorphous silicon, or any other suitable material, or any other conductive material. Alternatively, the conductive material 40 can be, e.g., any suitable conductive material or materials, e.g., Ag, Al, Cu, TaN, Ti, TiN, Co, Ru or any other suitable material, and can be deposited or formed in any suitable manner.

Figure 13:
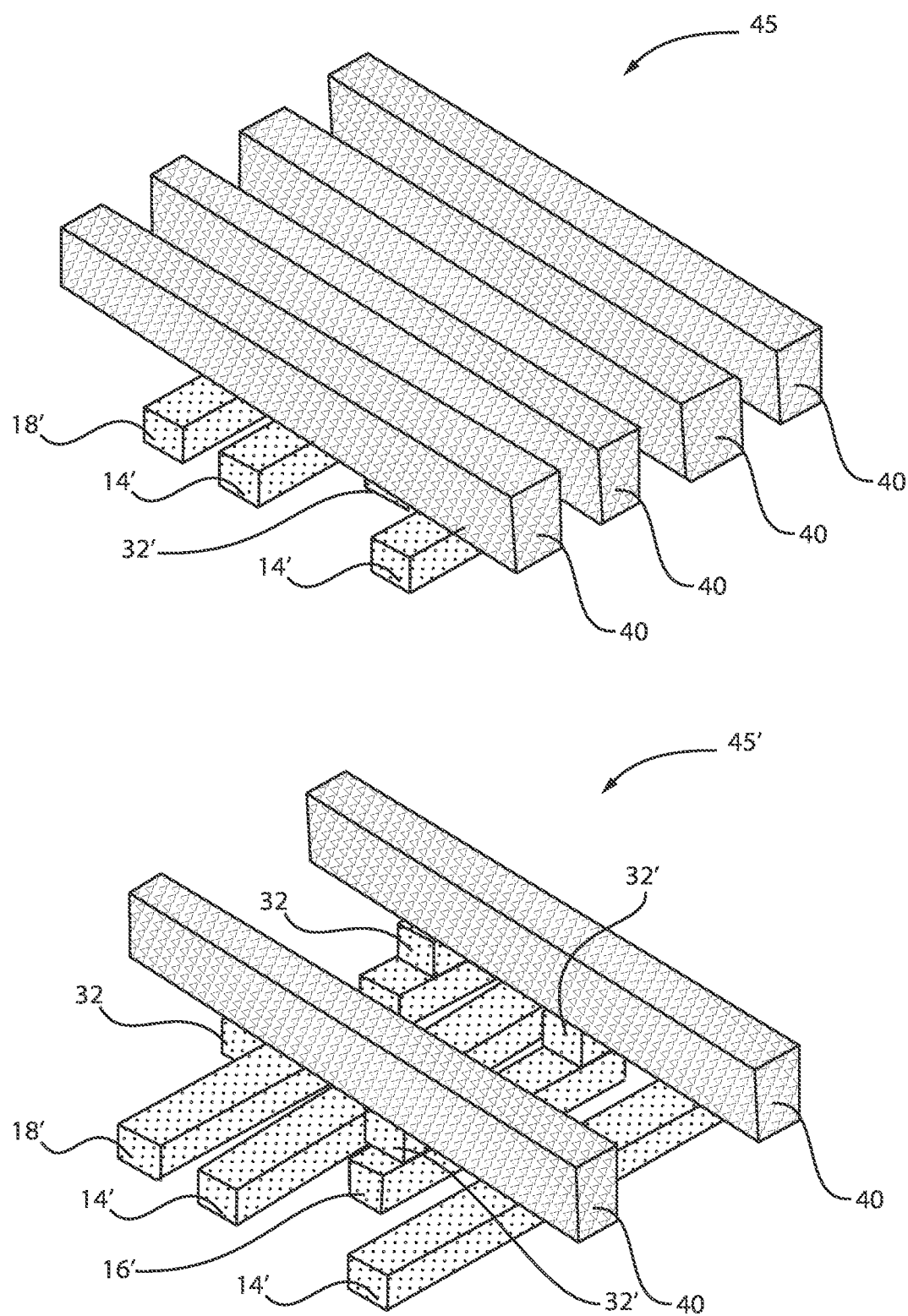
FIG. 13 is a perspective view of the semiconductor structure of FIG. 12 illustrating vias automatically aligned to metal lines both above and below the vias, where in the lower illustration, two lines are omitted to reveal the vias below, in accordance with an embodiment of the present invention.

FIG. 13 is a perspective view of the semiconductor structure of FIG. 12 illustrating vias automatically aligned to metal lines both above and below the vias, where in the lower illustration, two lines are omitted to reveal the vias below, in accordance with an embodiment of the present invention.

Structure 45 illustrates the structure of FIG. 12 where the dielectric materials 12, 24, 34 are removed to illustrate the vias 32, 32'. Structure 45' illustrates the structure of FIG. 12 where the dielectric materials 12, 24, 34 are removed, as well as a few conductive material strips 40 to better illustrate the vias 32, 32'. Thus, the vias 32, 32' automatically align to the conductive material strips 40 above and the conductive lines 14', 16', 18' below the vias 32, 32'. Conventional interconnect integration schemes have a via align to metal lines above or below the via. As a result, the overlay error between the via and one line above or one line below can cause yield and reliability issues. In contrast, the structures 45, 45' illustrate a double patterning integration scheme where a via automatically aligns to the metal lines above and below the via. As a result, there is no overlay error between the via and the line above and the line below. This configuration helps achieve better chip yield and reliability.

Structures 45, 45' depict the vias 32, 32' intersecting the conductive material strips 40 above and the conductive lines 14', 16', 18' below the vias 32, 32'. Therefore, a top line pattern is employed to form vias 32, 32' between top metal lines 40 and bottom metal lines 14', 16', 18' such that the vias 32, 32' can be fully aligned to both the top metal lines 40 and bottom metal lines 14', 16', 18'. The method employs a line pattern to define both top line and via between the top lines and the bottom lines. The structure employs a pattern top line and via in a process flow such that the vias 32, 32' align to both the conductive material strips 40 above and the metal lines 14', 16', 18' below the vias 32, 32'. Stated differently, the via is formed first with the bottom line by using a top line pattern, and then metallization to the line occurs. Thus, the exemplary embodiments employ a top via scheme. Additionally, the via dimension automatically matches the top and bottom line dimensions.

In summary, the exemplary embodiments of the present invention introduce a method and structure for forming self-aligned vias by employing top level line double patterns. The via level litho process is skipped in the integration scheme. The self-aligned vias are constructed by using a sacrificial line pattern to form the vias, and then convert the sacrificial line patterns into metal line patterns. As a result, the vias are fully aligned to the top level and bottom level metal lines. Additionally, the exemplary embodiments of the present invention eliminate line-to-via litho alignment errors, minimize contact resistance, maximize via current, and improve via reliability.

Regarding FIGS. 1-13, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for forming self-aligned vias by employing top level line double patterns (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming self-aligned vias by employing top level line double patterns, the method comprising:
   forming a plurality of first conductive lines of different lengths in parallel to each other within a first dielectric material such that only a single first conductive line of the plurality of first conductive lines is centrally disposed within the first dielectric material;

recessing one or more of the plurality of first conductive lines to create first openings and to define a first set of recessed first conductive lines and a second set of non-recessed first conductive lines;

filling the first openings with a second dielectric material such that top surfaces of the second set of non-recessed first conductive lines remain exposed;

forming sacrificial blocks perpendicular to the plurality of first conductive lines such that the top surfaces of the second set of non-recessed first conductive lines directly contact the sacrificial blocks;

forming vias directly underneath the sacrificial blocks by recessing the second set of non-recessed first conductive lines such that dual vias are formed from the centrally disposed single first conductive line;

removing the sacrificial blocks; and constructing a plurality of second conductive lines such that the vias align to both the plurality of first conductive lines and the plurality of second conductive lines, wherein the dual vias of the centrally disposed single first conductive line are horizontally aligned with all the other vias formed underneath the sacrificial blocks.

2. The method of claim 1, further comprising depositing a block mask before recessing the one or more of the plurality of first conductive lines.

3. The method of claim 1, wherein recessing the second set of non-recessed first conductive lines creates second openings.

4. The method of claim 3, further comprising filling the second openings with a third dielectric material.

5. The method of claim 4, wherein the first, second, and third dielectric materials are constructed from a same material.

6. The method of claim 1, wherein the sacrificial blocks are formed by etching a sacrificial material deposited over the second dielectric material.

7. The method of claim 1, wherein the plurality of first conductive lines are perpendicular to the plurality of second conductive lines.

8. The method of claim 1, wherein a dimension of the vias automatically matches dimensions for the plurality of first and second conductive lines.

9. The method of claim 1, wherein the vias are formed before constructing the plurality of second conductive lines.

10. A method for forming self-aligned vias by employing top level line double patterns, the method comprising:

forming a plurality of first conductive lines of different lengths in parallel to each other within a first dielectric material such that only a single first conductive line of the plurality of first conductive lines is centrally disposed within the first dielectric material;

depositing a block mask over one or more of the plurality of first conductive lines;

recessing exposed conductive lines of the plurality of first conductive lines to create first gaps and to define a first set of recessed first conductive lines and a second set of non-recessed first conductive lines;

removing the block mask;

filling the first gaps with a second dielectric material such that top surfaces of the second set of non-recessed first conductive lines remain exposed;

forming sacrificial blocks perpendicular to the plurality of first conductive lines such that the top surfaces of the second set of non-recessed first conductive lines directly contact the sacrificial blocks;

recessing the second set of non-recessed first conductive lines to create second gaps and vias such that dual vias are formed from the centrally disposed single first conductive line;

filling the second gaps with a third dielectric material;

forming trenches within the third dielectric material;

removing the sacrificial blocks to define third gaps; and filling the trenches and the third gaps with a conductive material to define a plurality of second conductive lines such that the vias align to both the plurality of first conductive lines and the plurality of second conductive lines, wherein the dual vias of the centrally disposed single first conductive line are horizontally aligned with all the other vias formed from the recessing of the second set of non-recessed first conductive lines.

11. The method of claim 10, wherein the sacrificial blocks are perpendicular to the plurality of first conductive lines.

12. The method of claim 10, wherein the first, second, and third dielectric materials are constructed from a same material.

13. The method of claim 10, wherein the trenches are parallel to the sacrificial blocks.

14. The method of claim 10, wherein the plurality of first conductive lines are perpendicular to the plurality of second conductive lines.

15. The method of claim 10, wherein a dimension of the vias automatically matches dimensions for the plurality of first and second conductive lines.

16. The method of claim 10, wherein the vias are formed before constructing the plurality of second conductive lines.

* * * * *